United States Patent
Yu et al.

(10) Patent No.: US 8,047,620 B2
(45) Date of Patent: Nov. 1, 2011

(54) MOUNTING MECHANISM FOR RETAINING A SLIDE RAIL TO A CHASSIS

(75) Inventors: Mo-Ming Yu, Shenzhen (CN); Hai-Chen Zhou, Shenzhen (CN); Song Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 583 days.

(21) Appl. No.: 12/166,260

(22) Filed: Jul. 1, 2008

(65) Prior Publication Data

US 2009/0218469 A1    Sep. 3, 2009

(30) Foreign Application Priority Data

Feb. 29, 2008    (CN) .......................... 2008 1 0300447

(51) Int. Cl.
 *A47B 95/02* (2006.01)
(52) U.S. Cl. ..................... 312/333; 312/334.1
(58) Field of Classification Search .................. 312/333, 312/334.1, 334.7–334.8, 334.44–334.47; 384/21
See application file for complete search history.

(56) References Cited

U.S. PATENT DOCUMENTS

| | | | | |
|---|---|---|---|---|
| 6,123,314 A * | 9/2000 | Steele | ............................. | 248/681 |
| 6,209,979 B1 * | 4/2001 | Fall et al. | ................... | 312/330.1 |
| 6,230,903 B1 * | 5/2001 | Abbott | ............................ | 211/26 |
| 6,373,707 B1 * | 4/2002 | Hutchins | ........................ | 361/725 |
| 6,375,290 B1 * | 4/2002 | Lin et al. | .................. | 312/334.46 |
| 6,601,933 B1 * | 8/2003 | Greenwald | .................... | 312/333 |
| 7,481,504 B2 * | 1/2009 | Chen et al. | ..................... | 312/333 |
| 7,513,581 B1 * | 4/2009 | Baiza et al. | ..................... | 312/333 |
| 7,552,899 B2 * | 6/2009 | Chen et al. | .................. | 248/224.8 |
| 7,604,307 B2 * | 10/2009 | Greenwald et al. | ........... | 312/333 |
| 7,661,778 B2 | 2/2010 | Yang et al. | | |
| 7,699,279 B2 * | 4/2010 | Chen et al. | ................. | 248/220.41 |
| 7,744,177 B2 * | 6/2010 | Peng et al. | .................. | 312/334.4 |
| 7,753,460 B2 | 7/2010 | Peng et al. | | |
| 7,798,581 B2 * | 9/2010 | Chen et al. | ................. | 312/265.1 |
| 7,871,139 B2 * | 1/2011 | Yu et al. | ........................ | 312/333 |
| 7,967,399 B1 * | 6/2011 | Baiza et al. | ................. | 312/223.1 |
| 2002/0089274 A1 * | 7/2002 | Liang et al. | .............. | 312/334.44 |
| 2003/0052580 A1 * | 3/2003 | Dobler et al. | ............ | 312/334.44 |
| 2004/0108797 A1 * | 6/2004 | Chen et al. | .................. | 312/334.7 |
| 2005/0088069 A1 * | 4/2005 | Greenwald et al. | ........... | 312/333 |

(Continued)

FOREIGN PATENT DOCUMENTS

CN    1943472 A    4/2007

(Continued)

*Primary Examiner* — Darnell Jayne
*Assistant Examiner* — Kimberley Wright
(74) *Attorney, Agent, or Firm* — Altis Law Group, Inc.

(57) ABSTRACT

A mounting mechanism is provided for retaining a slide rail to a chassis with an anchor member extending from a side thereof. The rail includes a mounting slot defined therein for receiving the anchor member of the slide rail. The mounting mechanism includes a resilient retaining member secured to the slide rail and a releasing member pivotably engaged with the retaining member. The retaining member includes a protrusion formed thereon capable of retaining the anchor member in the mounting slot of the slide rail. The releasing member is capable of being pivoted to urge the retaining member to disengage the protrusion thereof from the anchor member.

13 Claims, 6 Drawing Sheets

U.S. PATENT DOCUMENTS

| | | | |
|---|---|---|---|
| 2007/0018547 A1* | 1/2007 | Yang et al. | 312/333 |
| 2007/0114895 A1* | 5/2007 | Chen et al. | 312/333 |
| 2007/0296318 A1* | 12/2007 | Peng et al. | 312/334.44 |
| 2008/0067907 A1* | 3/2008 | Chen et al. | 312/312 |
| 2008/0246378 A1* | 10/2008 | Chen et al. | 312/334.46 |
| 2009/0218469 A1* | 9/2009 | Yu et al. | 248/430 |
| 2009/0289155 A1* | 11/2009 | Yu et al. | 248/205.1 |
| 2009/0294621 A1* | 12/2009 | Yu et al. | 248/429 |
| 2011/0017894 A1* | 1/2011 | Yu et al. | 248/309.1 |
| 2011/0017895 A1* | 1/2011 | Yu et al. | 248/309.1 |
| 2011/0024592 A1* | 2/2011 | Yu et al. | 248/309.1 |

FOREIGN PATENT DOCUMENTS

CN            101091610 A     12/2007

* cited by examiner

MOUNTING MECHANISM FOR RETAINING A SLIDE RAIL TO A CHASSIS

BACKGROUND

1. Field of the Invention

The present invention relates to mounting mechanisms, and more particularly to a mounting mechanism for mounting a slide rail to a chassis.

2. Description of Related Art

A typical slide rail assembly for a server chassis and a rack includes an outer slide rail mounted to the rack, an inner slide rail mounted to the chassis, and an intermediate slide rail mounted between the outer and inner slide rails. The intermediate slide rail is extendable relative to the outer slide rail, and the inner slide rail is extendable relative to the intermediate slide rail, thus the chassis can be extended a distance out from the rack. Conventionally, the inner rail is secured to a side of the chassis with a plurality of screws. Therefore, a tool such as a screwdriver is needed for installing and detaching the slide rail, and the processes are tedious and time consuming.

SUMMARY

In one embodiment, a mounting mechanism is provided for retaining a slide rail to a chassis, and the chassis having an anchor member extending from a side thereof. The rail includes a mounting slot defined therein for receiving the anchor member of the slide rail. The mounting mechanism includes a resilient retaining member secured to the slide rail and a releasing member pivotably engaged with the retaining member. The retaining member includes a protrusion formed thereon capable of retaining the anchor member in the mounting slot of the slide rail. The releasing member is capable of being pivoted to urge the retaining member to disengage the protrusion thereof from the anchor member.

Other advantages and novel features of the present invention will become more apparent from the following detailed description of embodiment when taken in conjunction with the accompanying drawings, in which:

DETAILED DESCRIPTION

Figure 1:
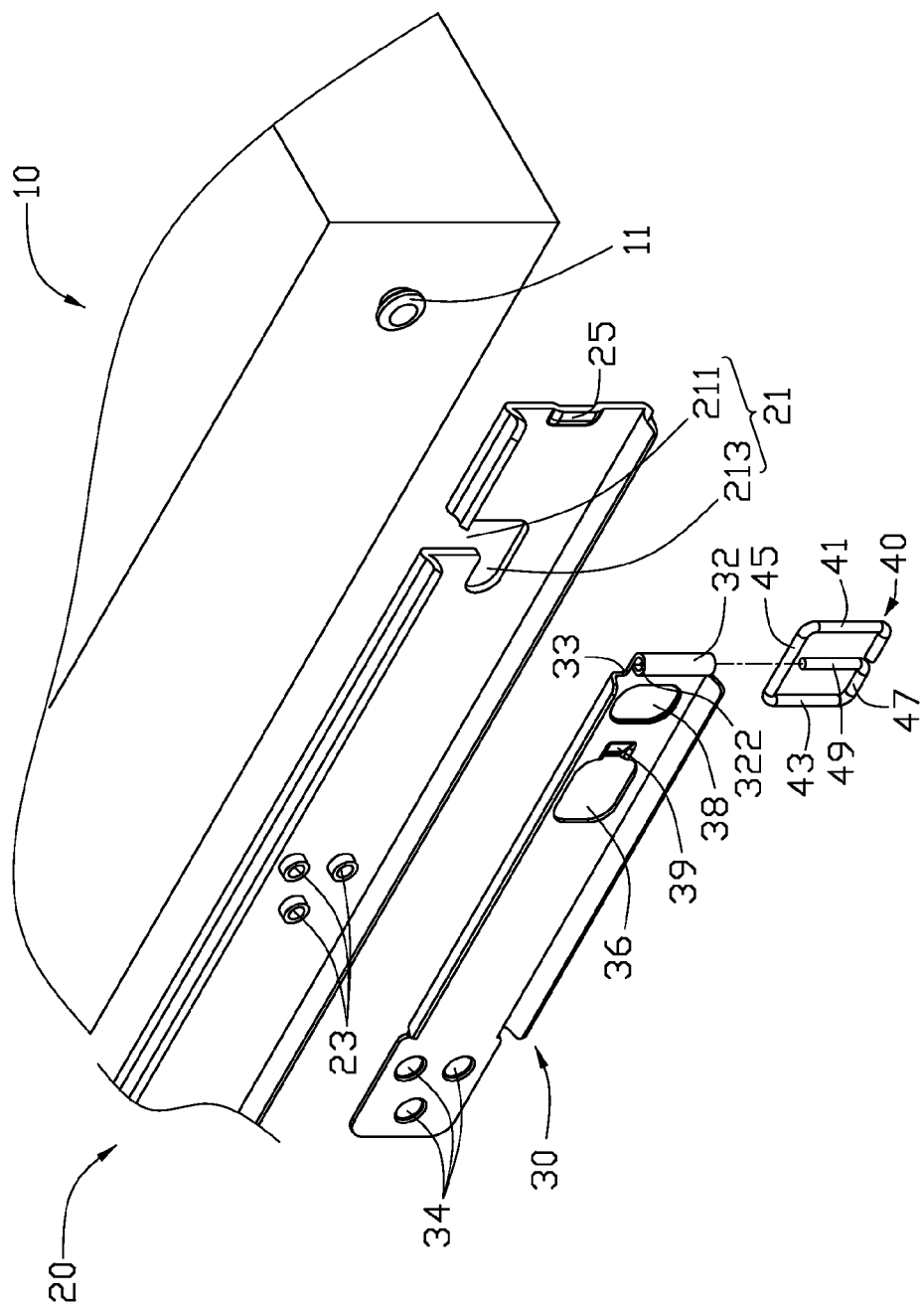
FIG. 1 is an exploded, isometric view of a mounting mechanism according to an embodiment of the present invention.

Referring to FIG. 1, a mounting mechanism in an embodiment of the present invention is provided for mounting a slide rail 20 to a chassis 10. The mounting mechanism includes a retaining member 30 coupled to the slide rail 20 and a releasing member 40 rotatably coupled to the retaining member 30.

The chassis 10 includes an anchor member 11 extending from a sidewall thereof. The anchor member 11 is a mushroom-shaped post, and includes a neck portion and a head portion with a diameter greater than that of the neck portion.

The slide rail 20 defines a J-shaped mounting slot 21. The mounting slot 21 includes a leading portion 211 and a positioning portion 213 communicating with the leading portion 211. A plurality of coupling portions 23 extends from the slide rail 20. A bulge 25 is formed at an end of the slide rail 20 adjacent to the mounting slot 21 thereof, and includes a guiding slope facing the mounting slot 21.

The retaining member 30 includes a resilient plate with a plurality of coupling holes 34 defined in a first end thereof. A pivoting portion 32 protrudes from a second end of the retaining member 30 with a pivoting hole 322 defined therein. A pair of shoulders 33 is formed at the second end of the retaining member 30 arranged at opposite sides of the pivoting portion 32. The retaining member 30 further includes a first cutout 36 and a second cutout 38 defined therein adjacent to the pivoting portion 32. There is a protrusion 39 on the retaining member 30 near the cutout 36.

The releasing member 40 is generally rectangular. A driven portion 41 and an operating portion 43 are respectively formed at opposite sides of the releasing member 40. An arm 45 and an arm 47 are respectively formed at other opposite sides connecting ends of the driven portion 40 and the operating portion 43. A shaft 49 perpendicularly extends from a free end of the arm 47 towards the arm 45.

Figure 2:
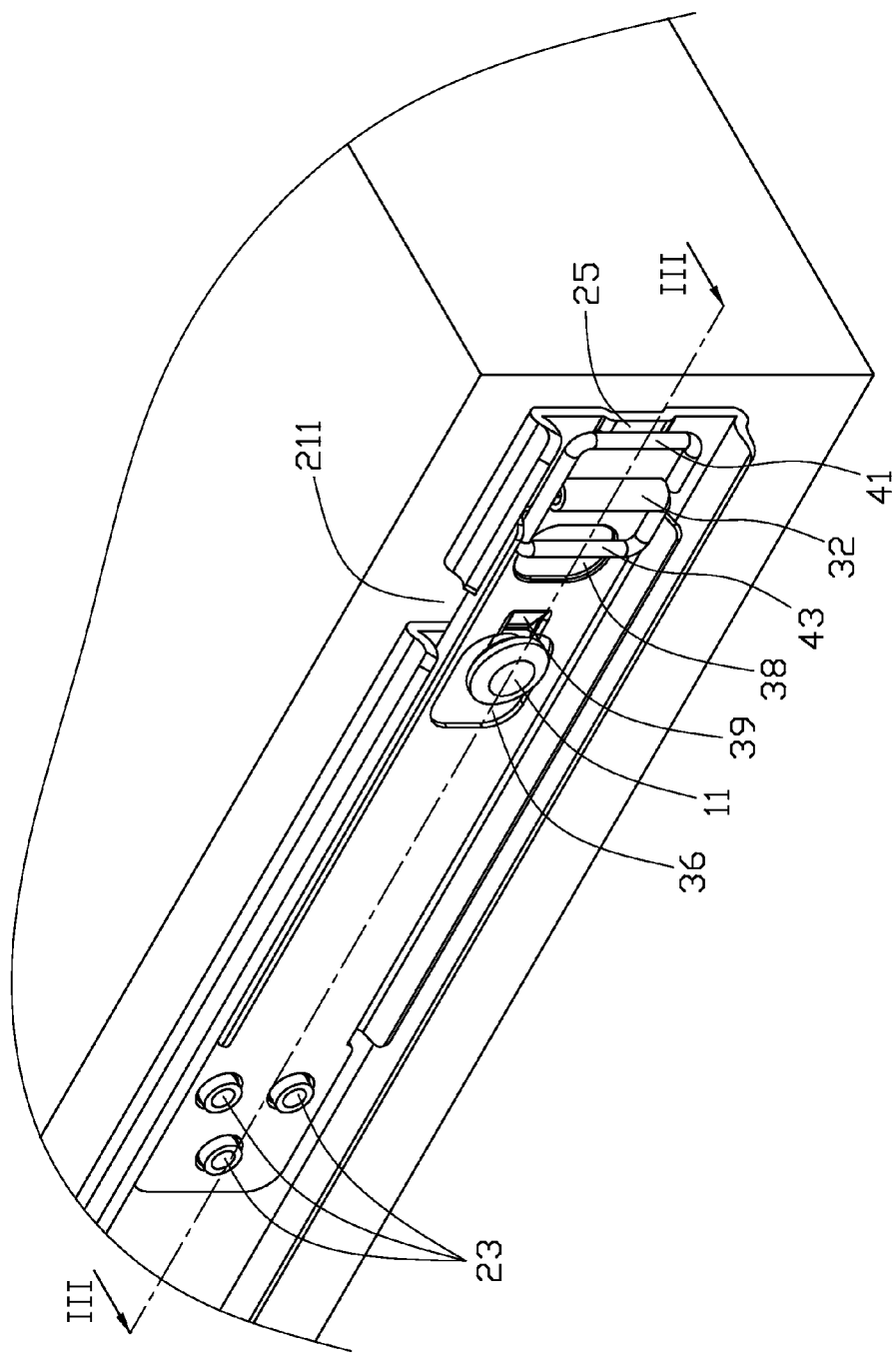
FIG. 2 is an assembled view of FIG. 1.
Figure 3:
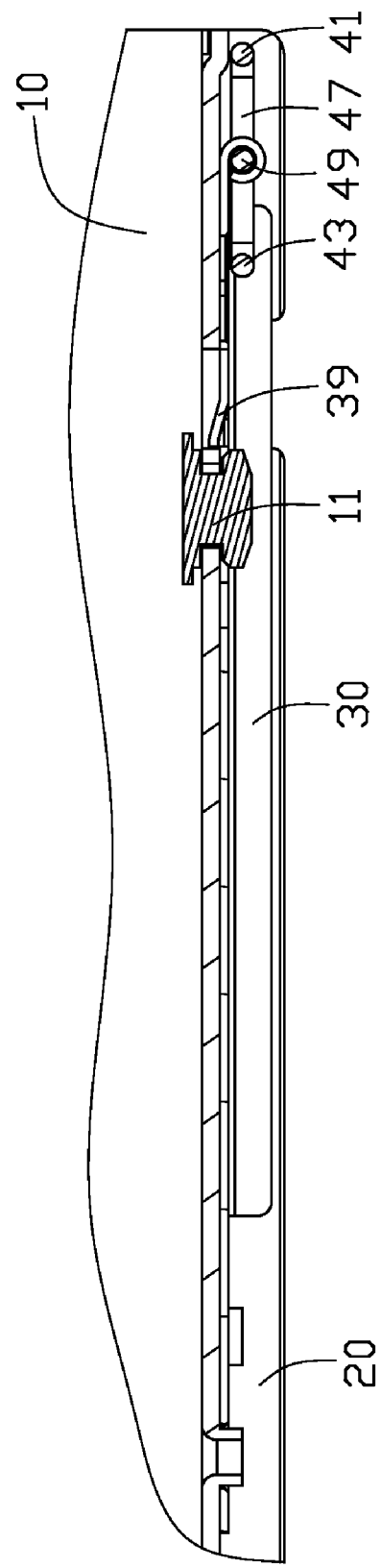
FIG. 3 is an enlarged, partially sectional view of FIG. 2 taken along line III-III.

Referring also to FIG. 2 and FIG. 3, the shaft 49 of the releasing member 40 is pivotably received in the pivoting hole 322 of the pivoting portion 32 of the retaining member 30. The coupling portions 23 of the slide rail 20 are correspondingly fixed in the coupling holes 34 of the retaining member 30, thus the first end of the retaining member 30 is secured to the slide rail 20. The first cutout 36 of the retaining member 30 is aligned with the positioning portion 213 of the mounting slot 21 of the slide rail 20. The operating portion 43 of the releasing member 40 is aligned with the second cutout 38 of the retaining member 30. The driven portion 41 of the releasing member 40 abuts against the guiding slope of the bulge 25 of the slide rail 20.

To mount the slide rail 20 to the chassis 10, the chassis 10 is moved to fit the neck of the anchor member 11 into the mounting slot 21. The anchor member 11 slides down along the leading portion 211 of the mounting slot 21. The head of the anchor member 11 engages with the retaining member 30 and urges the second end of the retaining member 30 to move away from the slide rail 20. The retaining member 30 is deformed. When the neck of the anchor member 11 slides into the positioning portion 211 of the mounting slot 21, the head of the anchor member 11 extends through the first cutout 36 of the retaining member 30, and then the retaining member 30 is restored. The protrusion 39 engages with the head of the anchor member 11 to retain the anchor member 11 in the positioning portion 213 of the mounting slot 21. Thus, the slide rail 20 is secured to the chassis 10.

Figure 4:
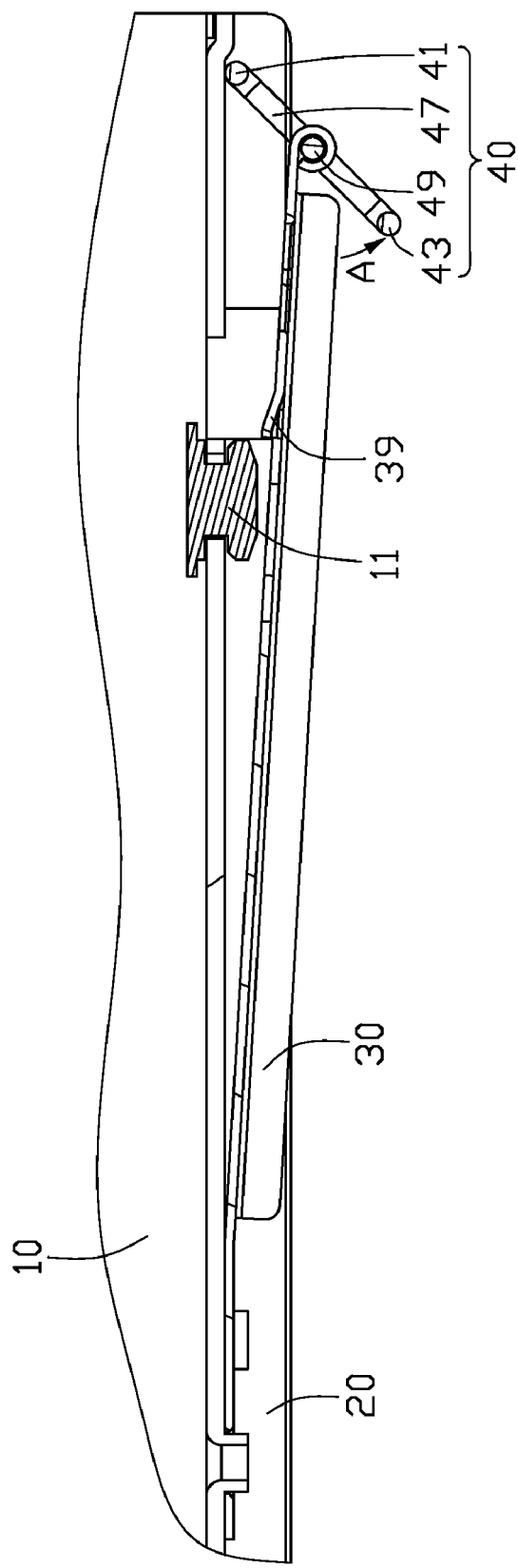
FIG. 4 is another sectional view showing the releasing member during rotation.

Referring also to FIG. 4, to detach the slide rail 20 from the chassis 10, the operating portion 43 is manipulated to pivot the releasing member 40 about the shaft 49 thereof in a direction indicated by arrow A. The driven portion 41 is slid along the guiding slope of the bulge 25 to abut against the slide rail 20. The retaining member 30 is deformed, and the first end the retaining member 30 is urged to move away from the slide rail 20. The protrusion 39 is disengaged from the anchor member 11.

Figure 5:
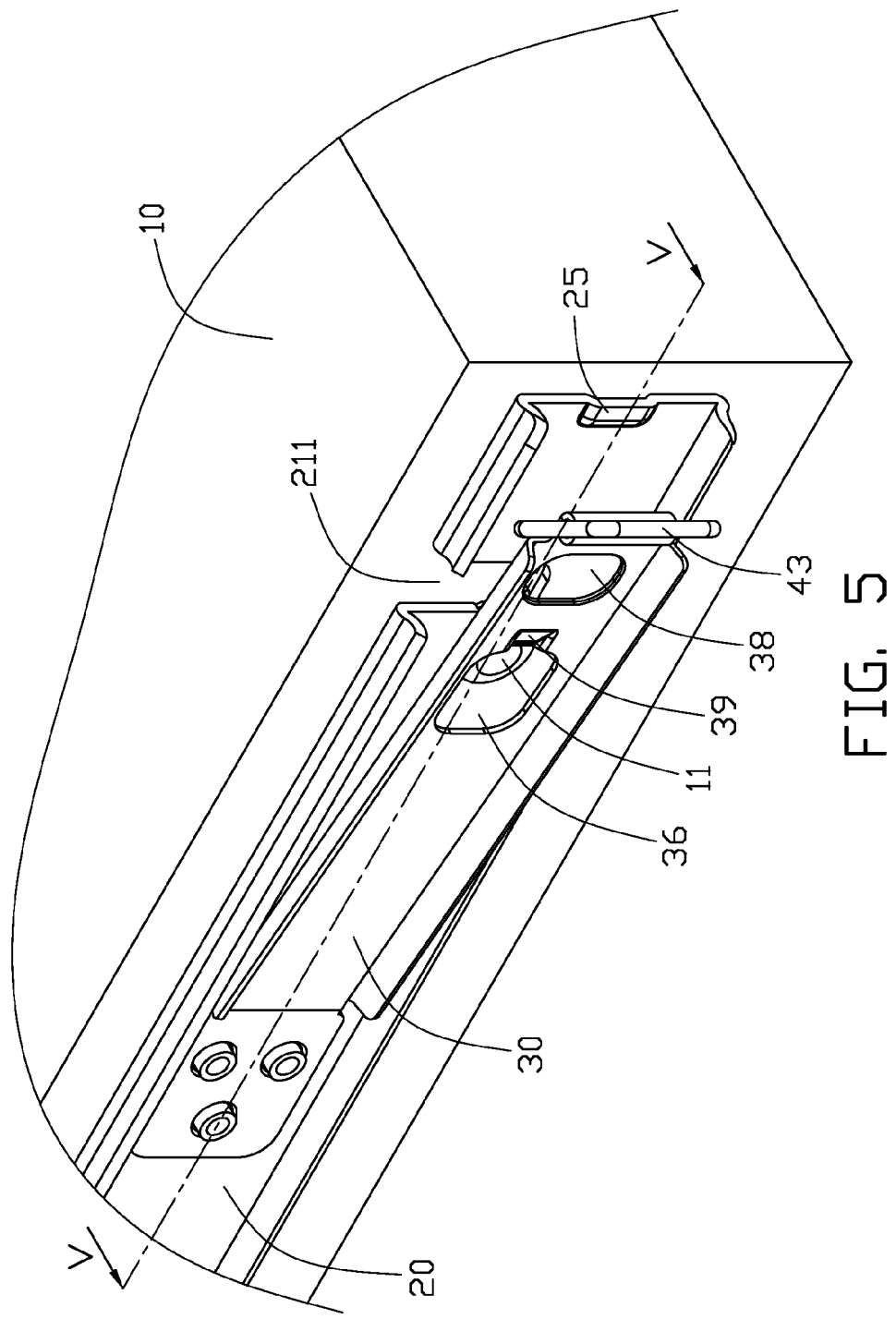
FIG. 5 is another assembled view of FIG. 1.
Figure 6:
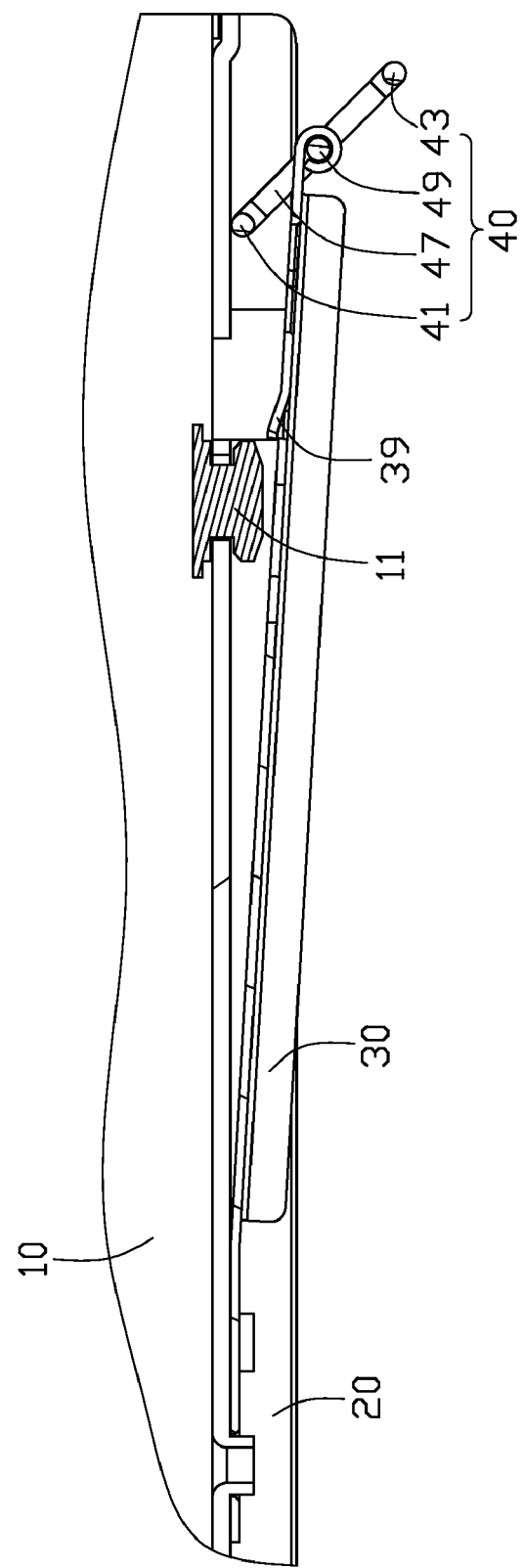
FIG. 6 is an enlarged, partially sectional view of FIG. 4 taken along line V-V.

Referring also to FIGS. 5 and 6, the releasing member 40 is pivoted until the arms 45 and 47 thereof slantingly engage with the shoulders 33 of the retaining member 30, respectively. The driven portion is generally located between the retaining member 30 and the slide rail 20, so that the retaining member 30 is kept in a position to allow the anchor member 11 to exit from the positioning portion 213 of the mounting slot 21. Then the chassis 10 is moved to allow the neck of the anchor member 11 to slide out of the positioning portion 213 of the mounting slot 21, and then slide upwards out of the leading portion 211 thereof. Thus, the slide rail 20 is detached from the chassis 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting mechanism, the mounting mechanism comprising:
    a slide rail defining a mounting slot;
    a chassis comprising an anchor member received in the mounting slot of the slide rail;
    a retaining member, wherein the retaining member comprises a retaining member first end fixed to the slide rail, a pivoting portion formed at a retaining member second end, and a protrusion adjacent to the pivoting portion to engage with the anchor member to lock the anchor member in the mounting slot; and
    a releasing member comprising a shaft pivotably received in the pivoting portion of the retaining member, a driven portion, and an operating portion arranged at opposite sides of the shaft of the releasing member;
    wherein the retaining member second end is moved away from the slide rail to disengage the protrusion of the retaining member from the anchor member of the chassis, in response to the releasing member being pivoted to make the operating portion of the releasing member move away from the slide rail and the driven portion of the releasing member slide on the slide rail.

2. The mounting mechanism as described in claim 1, wherein a bulge forming a guiding slope is arranged at a slide rail end, the driven portion of the releasing member engages with the bulge, and move along the guiding slope on the condition that the releasing member is pivoted to make the operating portion of the releasing member move away from the slide rail.

3. The mounting mechanism as described in claim 1, wherein a cutout is defined in the retaining member to enable a user to manipulating the operating portion.

4. The mounting mechanism as described in claim 2, wherein a shoulder is formed at the retaining member second end, the releasing member further comprises an arm extending from the driven portion to abut against the shoulder of the retaining member.

5. A slide rail assembly the slide rail assembly comprising:
    a slide rail defining a mounting slot adapted to receive a post of a chassis;
    a retaining member, wherein a retaining member first end is fixed to the slide rail, and a retaining member second end is cantilevered and movable relative to the slide rail to regulate entry and exit of the post relative to the mounting slot of the slide rail and a protrusion retaining the post member in the slide rail mounting slot; and
    a releasing member pivotably coupled to the retaining member second end, and comprising a driven portion and an operating portion arranged at opposite sides of the releasing member, said driven portion urgingly sliding on the slide rail in response to the releasing member pivoting relative to the retaining member between a first position to raise the retaining member second end away from the slide rail, thereby disengaging the protrusion from the post, and a second position to allow the retaining member second end to move towards the slide rail to engage with the post.

6. The slide rail assembly as described in claim 5, wherein the slide rail mounting slot is J-shaped, comprises a leading portion and a positioning portion communicating with the leading portion; and is capable of accepting the post in both the leading portion and the positioning portion.

7. The slide rail assembly as described in claim 5, wherein the releasing member is rectangular and made of a bent metal wire.

8. The slide rail assembly as described in claim 7, wherein the releasing member comprises a shaft located between the driven portion and the operating portion, the retaining member comprises a pivoting portion that receives the shaft.

9. A mounting method comprising:
    providing
    a slide rail comprising a mounting slot defined therein, a chassis comprising an anchor member, a retaining member, and a releasing member;
    wherein the chassis anchor member is received in the slide rail mounting slot; the retaining member comprises a first end fixed to the slide rail and a protrusion retaining the anchor member in the slide rail mounting slot; the releasing member is pivotably coupled to the retaining member, and forms a driven portion and an operating portion at opposite ends of the releasing member; and
    rotating the releasing member with the operating portion of the releasing member moving away from the slide rail and the driven portion of the releasing member sliding on the slide rail to urge the retaining member to move away from the slide rail, thereby causing the release of the anchor member from the protrusion.

10. The mounting method as described in claim 9, wherein the releasing member further comprises a shaft arranged between the operating portion and the driven portion, and rotatably received in a pivoting portion of the retaining member.

11. The mounting method as described in claim 9, in the rotating step, sliding the driven portion of the releasing member along a guiding slope of a bulge of the slide rail.

12. The mounting method as described in claim 9, wherein a cutout defined in the retaining member for providing operation space to get leverage on the operating portion.

13. The mounting method as described in claim 9, in the rotating step, resting an arm of the releasing member on a shoulder of the retaining member.

* * * * *